United States Patent [19]
Schiltmans

[11] Patent Number: 5,774,093
[45] Date of Patent: Jun. 30, 1998

[54] CIRCUIT ARRANGEMENT FOR PROCESSING A FIRST OR A SECOND HIGH-FREQUENCY SIGNAL

[75] Inventor: Ronald Schiltmans, Eindhoven, Netherlands

[73] Assignee: U.S. Philips Corporation, New York, N.Y.

[21] Appl. No.: 620,680

[22] Filed: Mar. 19, 1996

[30] Foreign Application Priority Data

Mar. 25, 1995 [DE] Germany ................ 195 11 103.6

[51] Int. Cl.[6] ................ H01Q 15/24; H01P 1/161
[52] U.S. Cl. ................ 343/756; 333/101; 333/126; 333/21 A; 333/26; 333/33
[58] Field of Search ................ 333/101, 125, 333/137, 21 A, 26, 33; 343/756

[56] References Cited

U.S. PATENT DOCUMENTS

| | | | |
|---|---|---|---|
| 3,654,566 | 4/1972 | Wellhausen et al. | 330/124 |
| 4,595,890 | 6/1986 | Cloutier | 333/125 X |
| 4,623,848 | 11/1986 | Saka et al. | 333/26 X |
| 4,679,249 | 7/1987 | Tanaka et al. | 333/26 X |
| 4,959,873 | 9/1990 | Flynn et al. | 455/303 |

FOREIGN PATENT DOCUMENTS

| | | |
|---|---|---|
| 4305906A1 | 9/1994 | Germany . |
| 4305908A1 | 9/1994 | Germany . |
| 4035201 | 2/1992 | Japan ................ 333/21 A |
| 5136609 | 6/1993 | Japan ................ 333/26 |
| 2235340A | 2/1991 | United Kingdom . |

*Primary Examiner*—Benny T. Lee
*Attorney, Agent, or Firm*—Robert J. Kraus

[57] ABSTRACT

A description follows of a circuit arrangement for selectively processing a first or a second high-frequency signal, which guarantees a proper broadband separation of the high-frequency signals comprising a first inserting device for inserting the first high-frequency signal from a common waveguide arrangement into a first signal processing branch, a second inserting device for inserting the second high-frequency signal from the common waveguide arrangement into a second signal processing branch, a switchable high-frequency amplifying arrangement in each signal processing branch for selectively switching and amplifying, and blocking respectively, the associated inserted high-frequency signal, and a transmission arrangement in each signal processing branch for transmitting the associated high-frequency signal from the first or second respectively, inserting device to the associated, switchable high-frequency amplifying arrangement, in which each of the transmission arrangements comprises a high-frequency preamplifier which is switched to the associated inserting device via a first switching element, and to the associated switchable high-frequency amplifying arrangement via a second switching element, the first switching elements effecting a matching of the characteristic impedances of the inserting devices and the associated high-frequency preamplifiers and the second switching elements effecting a matching of the characteristic impedances of the high-frequency preamplifiers and the associated switchable high-frequency amplifying arrangements, and the latter matching of the characteristic impedances being effected both for the switched and for the blocked state of the associated high-frequency amplifying arrangements.

5 Claims, 1 Drawing Sheet

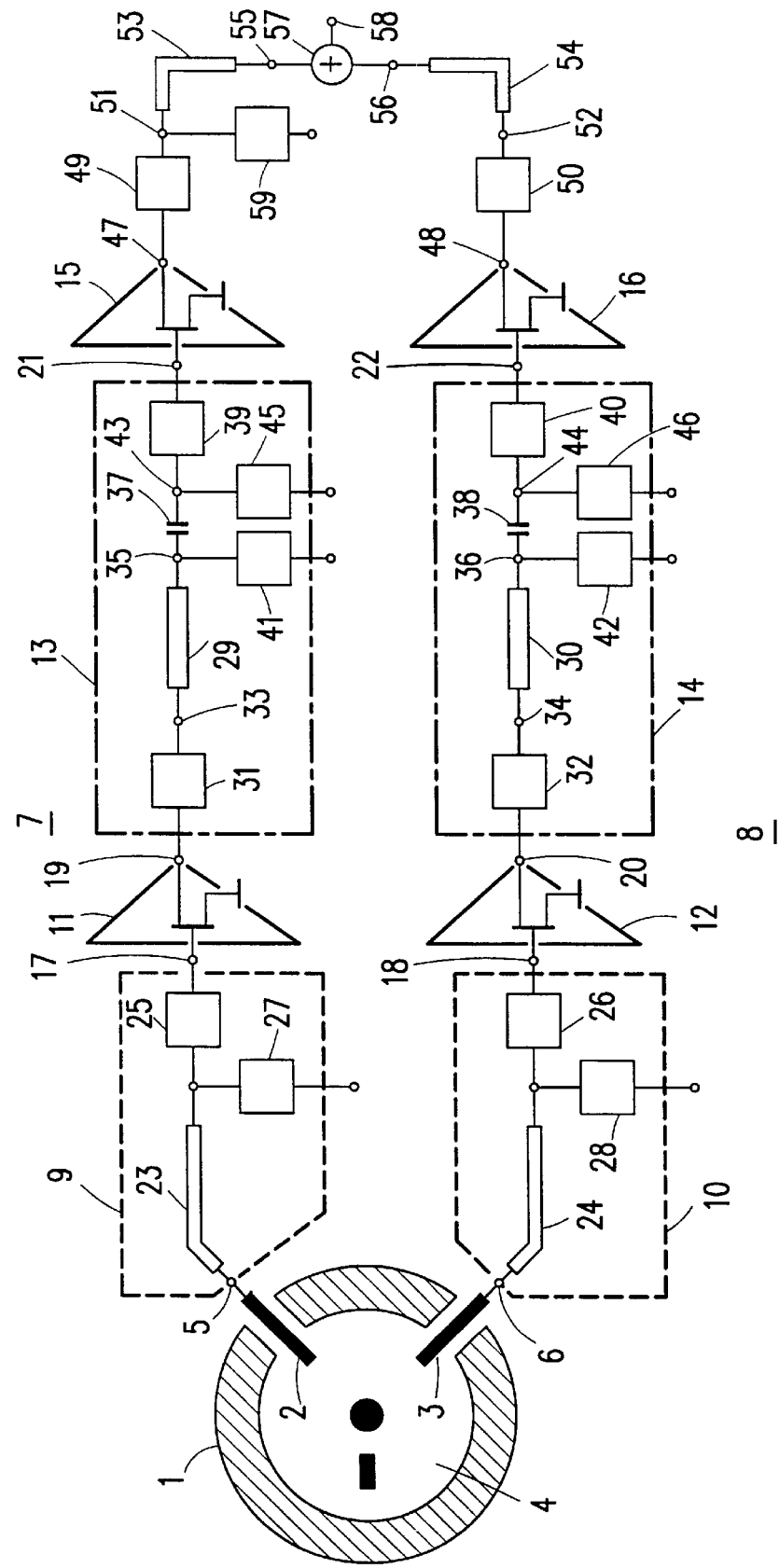

CIRCUIT ARRANGEMENT FOR PROCESSING A FIRST OR A SECOND HIGH-FREQUENCY SIGNAL

BACKGROUND OF THE INVENTION

1. Field of the Invention

The invention relates to a circuit arrangement for selectively processing a first or a second high-frequency signal.

2. Description of the Related Art

U.S. Pat. No. 4,959,873 discloses a known transmission line switching circuit which makes it possible to switch a single output line to one of two or more input lines to which the output line is connected at a junction. Each input line has an associated amplifier stage which, when biased, can be brought to a high-gain "on" state, or to an isolating "off" state. Suitable biasing in the "off" state ensures that the respective amplifier stage output presents a low impedance to the corresponding input line. The length of the corresponding input line is chosen to reflect a high impedance at the junction with the other lines. Furthermore, by choosing correct physical dimensions of each input line, the return loss and insertion loss of the "on" signal path are kept to low values while, simultaneously, a high insertion loss in the "off" signal path is presented.

Published German Patent Application DE 43 05 908 which is hereby incorporated by reference, discloses a known waveguide arrangement for switching energy fed to a waveguide cavity to two signal lines, each coupled to a respective probe extending into the waveguide cavity. A conductive resonance element arranged centrally in the waveguide cavity with respect to its cross-section is tuned to the wavelength of the energy fed to the waveguide cavity, so that the element can absorb the energy in the best possible way, and the absorbed energy on the probes arranged orthogonally to the longitudinal axis of the waveguide cavity and orthogonally to each other, is extracted. A similar waveguide arrangement, in which an electrically conductive isolation element instead of the resonance element occurs in the waveguide cavity, is known from published German Patent Application DE 43 05 906 which is hereby incorporated by reference. Cross-polarized waves can be received by these waveguide arrangements and, with a proper neutralization of cross-polarization, be applied separately to the input lines of the arrangement known from U.S. Pat. No. 4,959,873.

However, in practice it has appeared that the characteristic impedances achieved with such an arrangement may be obtained for particular transmission line dimensions only in a frequency band that is not adequate for the transmission of specific high-frequency signals. When high-frequency signals having a higher relative bandwidth are transmitted, there will be a distinct mismatch along the borders of the transmitted frequency band either in the "on" or in the "off" state of the amplifier stage.

This causes reflections to occur, which leads to undesirable interference in the received high-frequency signals. Particularly these reflections, i.e. mismatches caused thereby, produce a cross-polarization which results in crosstalk occurring between the crosspolarized waves, so that the neutralization of the cross-polarization is impaired. Furthermore, the mismatch causes a transmission loss i.e., a loss of wave attenuation to occur. A careful tuning and matching of the characteristic impedances and of the line lengths does not lead to a sufficient reduction of these disturbances either.

SUMMARY OF THE INVENTION

It is an object of the invention to provide a circuit arrangement of the type defined in the opening paragraph in which it is possible to process as before broadband signals with minimal interference in a simple manner.

This object is achieved according to the invention by a circuit arrangement for selectively processing a first or a second high-frequency signal, comprising:

a first inserting device for inserting the first high-frequency signal from a common waveguide arrangement into a first signal processing branch;

a second inserting device for inserting the second high-frequency signal from the common waveguide arrangement into a second signal processing branch;

a respective switchable high-frequency amplifying arrangement in each signal processing branch for selectively amplifying or blocking the associated inserted high-frequency signal; and a respective transmission arrangement in each signal processing branch for transmitting the associated high-frequency signal from the respective first or second inserting device to the associated switchable high-frequency amplifying arrangements.

Each of the transmission arrangements comprises a high-frequency preamplifier which is connected to the associated inserting device via a first matching element, and to the associated switchable high-frequency amplifying arrangement via a second matching element, the first matching element effecting a first matching of the characteristic impedances of the inserting devices and the associated high-frequency preamplifiers and the second matching elements effecting a second matching of the characteristic impedances of the high-frequency preamplifiers and the associated, switchable high-frequency amplifying arrangements, and the second matching of the characteristic impedances of the high-frequency preamplifiers and the associated switchable high-frequency amplifying arrangements being effected both for the switched and the blocked state of the associated high-frequency amplifying arrangements.

The invention is based on the recognition that problems with the characteristic impedance matching particularly occur because the input impedance of the switchable high-frequency amplifying arrangements is changed between the switched and the blocked states. It is then no longer possible to adapt sufficiently accurately the inserting devices and the switchable high-frequency amplifying arrangements to each other for the two operating states of these high-frequency amplifying arrangements over a large bandwidth. The high-frequency preamplifiers arranged according to the invention, which are constantly in the switched mode, now form a fixed-impedance termination for the inserting devices in each operating state, which impedance can be adapted to the inserting devices over a large bandwidth. The output impedances of these high-frequency preamplifiers, on the other hand, can be adapted in a simpler manner to the varying input impedances of the associated switchable high-frequency amplifying arrangements. This two-stage set up in each signal processing branch furthermore achieves a higher signal gain. Proper matching then at most develops slight reflections in a broad frequency band, so that overall a low-noise signal processing for broadband high-frequency signals is made possible. A preferred field of application for such circuit arrangements is the reception of satellite signals, for which the invention creates a highly simple, efficient and cost-effective arrangement.

An advantageous further embodiment of the invention is characterized in that the waveguide arrangement has a cavity and in that the respective inserting devices comprise each a probe extending into this cavity while the probes are tuned to the wavelength of the high-frequency signals fed to the cavity of the waveguide arrangement, so that the probes take up the energy of these high-frequency signals from the waveguide arrangement in the best possible way.

With these inserting devices arranged particularly according to the published German Patent Applications 43 05 906 and 43 05 908, it is possible to provide highly compact, efficient satellite receiving arrangements. Because of the large bandwidth and the high channel density made possible with the type of inserting devices, a single circuit arrangement of the type according to the invention can be used with a mutually independent dimensioning for a very large number of high-frequency signals. For example, the number of received satellite television programs, which can be processed by a single receiver arrangement, can be increased considerably. Therefore, a larger number of programs can therefore be offered at very moderate cost as regards circuitry.

Another, advantageous further embodiment is characterized in that the first switching elements each have a signal line by which the high-frequency signals are transported from the associated inserting device to the associated high-frequency preamplifier, and in that the length and characteristic impedance of this signal line are tuned to a signal transmission that is at least substantially free of reflection. This achieves a highly simple waveguide arrangement with a low-noise transmission property.

Preferably, the high-frequency preamplifiers and the switchable high-frequency amplifying arrangements are formed by transistors which have a high charge carrier mobility. When using "HEMT" transistors, which have a very small internal noise value, a very low-noise transmission of the high-frequency signal is achieved, despite the addition of the high-frequency preamplifiers to the switchable high-frequency amplifying arrangements.

Preferably, the second switching elements each have a DC isolation element by which the high-frequency preamplifier is DC-isolated from the associated switchable high-frequency amplifying arrangement. This simplifies the separate supply of supply voltages.

BRIEF DESCRIPTION OF THE DRAWINGS

The Figure represents an exemplary embodiment of a circuit arrangement according to the invention.

DESCRIPTION OF THE PREFERRED EMBODIMENTS

The exemplary embodiment shown in the figure illustrates a preferred waveguide arrangement 1 which is similar to the waveguide arrangement disclosed in published German Patent Application DE 43 05 908. Alternatively the waveguide arrangement 1 may be embodied differently, e.g. as described in published German Patent Application DE 43 05 906.

The waveguide arrangement 1 comprises a first inserting device 2 and a second inserting device 3. The two inserting devices 2, 3 each comprise a probe extending into a cavity 4 of the waveguide arrangement 1. These probes are tuned to the wavelength of the high-frequency signals fed to the cavity 4 of the waveguide arrangement 1, so that they absorb the energy of these high-frequency signals from the waveguide arrangement 1 in the best possible way. The high-frequency signals are then available on terminals 5, 6 of the inserting devices 2 and 3 respectively, for further processing.

The exemplary embodiment further comprises a first signal processing branch 7 and a second signal processing branch 8. Each of the signal processing branches 7, 8 comprises a first switching element 9, 10 respectively, whose input is formed by the terminal 5, 6 respectively of the inserting device 2, 3 respectively, and comprises a high-frequency preamplifier 11, 12, respectively a second switching element 13, 14 respectively and a switchable high-frequency amplifying arrangement 15, 16, respectively. In each of the signal processing branches 7, 8, the output 17, 18 of the first switching element 9, 10 respectively, is connected to an input of the high-frequency preamplifier 11, 12, respectively. Output 19, 20 of the high-frequency preamplifier 11, 12 respectively, is connected to an input of the second switching element 13, 14 respectively, whose output 21, 22 is connected to the input of the associated switchable high-frequency amplifying arrangement 15, 16, respectively.

Each of the first switching elements 9, 10 comprises a signal line 23, 24 respectively, by which the high-frequency signals are transported from the associated inserting device 2, 3 respectively, to the associated high-frequency preamplifier 11, 12. The length and the characteristic impedance of this signal line 23, 24 can be tuned to provide at least substantially reflectionless signal transmission from the inserting device 2, 3 to the high-frequency preamplifier 11, 12, respectively. Preferably, the characteristic impedance of the signal line 23, 24 is tuned to the characteristic impedance of the associated inserting device 2, 3 respectively, so that a reflectionless transition from the inserting device 2, 3 to the signal line 23, 24 respectively, is the result. If, as is shown in the drawing Figure, a first matching circuit 25, 26 respectively, is inserted between the signal line 23, 24 and the output 17, 18 respectively, of the first switching element 9, 10, the matching of the characteristic impedance between the signal line 23, 24 and the high-frequency preamplifier 11, 12 respectively, can even be effected irrespective of the line length of the signal line 23, 24, respectively. This creates an additional degree of freedom with respect to the dimensioning of the circuit arrangement according to the invention.

The first switching element 9, 10 further comprises a first DC switching arrangement 27, 28, respectively. This DC switching arrangement 27, 28, together with the first matching circuit 25, 26 respectively, is arranged such that there is impedance matching also at the end of the signal line 23, 24 respectively, near to the high-frequency preamplifier 11, 12, while a transformation of the characteristic impedance takes place for the transition of the high-frequency signals from the first switching element 9, 10 to the high-frequency preamplifier 11, 12 respectively, and the DC switching arrangement 27, 28 has a maximum attenuation for the high-frequency signals. Furthermore, the DC switching arrangement 27, 28 is used for the DC power supply to the input of the high-frequency preamplifier 11, 12, respectively.

The high-frequency preamplifier 11, 12 respectively, is formed in the present exemplary embodiment by field effect transistors which have a high charge carrier mobility, so-called "HEMT" transistors. They have a very low internal noise level, so that a very low-noise preamplification of the high-frequency signals is possible, which still have a very small amplitude at this point of the signal processing branch 7, 8, respectively. The high-frequency preamplifier 11, 12 respectively, produces preamplified high-frequency signals on the output 19, 20, respectively.

The second switching element 13, 14 respectively, also comprises a signal line 29, 30. The signal line 29, 30 respectively, is connected by its input 33, 34 via the second matching circuit 31, 32 respectively, to the output 19, 20 of the high-frequency preamplifier 11, 12, respectively. The second matching circuit 31, 32 respectively, causes a transformation of the characteristic impedance of the high-frequency preamplifier 11, 12 on the signal line 29, 30, respectively. At output 35, 36 respectively, the signal line 29, 30 is connected to the output 21, 22 of the second switching element 13, 14 respectively, via a series combination of a DC isolation element 37, 38 and a third matching circuit 39, 40, respectively. To the output 35, 36 of the signal line 29, 30 respectively, is connected a second DC switching arrangement 41, 42, respectively; to the connection point 43, 44 respectively, between the DC isolating element 37, 38 and the third matching circuit 39, 40 is connected a third DC switching arrangement 45, 46, respectively.

In the embodiment shown, the second matching circuit 31, 32 respectively, represents a DC short-circuit, so that the high-frequency preamplifier 11, 12 can be directly supplied with a DC supply current via the second DC switching arrangement 41, 42, respectively. The transistor of the high-frequency preamplifier 11, 12 is connected with its source electrode to ground; the gate electrode forms the input (reference 17, 18, respectively) and the drain electrode forms the output 19, 20, respectively. Constant bias voltages are supplied via the first and second DC switching arrangements 27, 28 and 41, 42 respectively, so that the high-frequency preamplifier 11, 12 respectively, always works with a preferably fixed working point. Therefore, the preamplifier has fixed input and output impedances for which the first and second matching circuits 25, 26 and 31, 32 respectively, having mutually independent dimensions, guarantee a proper, broadband matching of the characteristic impedance.

The switchable high-frequency amplifying arrangement 15, 16 is switched by its output 47, 48 respectively, via a fourth matching circuit 49, 50 to input 51, 52 of an output-side signal line 53, 54 of the signal processing branch 7, 8, respectively. The fourth matching circuit 49, 50 provides a characteristic impedance matching of the output impedance of the switchable high-frequency amplifying arrangement 15, 16 respectively, and the respective output-side signal line 53, 54. This matching may preferably be designed in such a way that it is optimized for the switched state of the high-frequency amplifying arrangement 15, 16, respectively. A respective characteristic impedance matching of the second switching element 13, 14 and the switchable high-frequency amplifying arrangement 15, 16 respectively, via the third matching circuit 39, 40, which is inserted between the connection point 43, 44 and the output 21, 22 respectively, of the second switching element 13, 14 and thus to the connected input of the switchable high-frequency amplifying arrangement 15, 16 respectively, provides an optimum, i.e. low-loss and low-reflection signal transport in the switched state of the switchable high-frequency amplifying arrangement 15, 16, respectively.

The output 55, 56 of signal line 53, 54 respectively, is connected to an input of a superpositioning stage 57. In the superpositioning stage 57, which is formed in the simplest case by a line junction, the high-frequency signals from the signal processing branches 7 and 8 are combined on a common line, which may be connected to the output 58 of the superpositioning stage 57, but is not shown in the Figure for simplicity. In addition, further DC switching arrangements for the switchable high-frequency amplifying arrangement 15, 16 respectively can be connected to the input 51, 52 of the output signal line 53, 54 respectively. In the exemplary embodiment shown, only a single fourth DC switching arrangement 59 is connected to the input 51 of the output-side signal line 53 in the first signal processing branch 7. The switchable high-frequency amplifying arrangement 15, 16 respectively, preferably comprises at least a substantially identical transistor, advantageously a "HEMT" transistor, arranged in accordance with the transistor in the high-frequency preamplifier 11, 12, respectively: its gate electrode is connected to the output 21, 22 of the second switching element 13, 14, respectively its source electrode is connected to ground and its drain electrode is connected to the output 47, 48 of the switchable high-frequency amplifying arrangement 15, 16, respectively. The fourth matching circuit 49, 50 respectively, and the superpositioning stage 57 pass DC current, so that a common DC bias voltage can be fed to the drain electrode of the transistor in the switchable high-frequency amplifying arrangement 15, 16 respectively, via the fourth DC switching arrangement 59 which preferably provides an open-circuit for the high-frequency signals. Arrangement 59 and the fourth matching circuit 49 of the first signal processing branch 7 optionally have a mutually dependent dimensioning. The selective switching or blocking respectively, of the switchable high-frequency amplifying arrangement 15, 16 is then preferably effected by the DC bias voltage supplied via the third DC switching arrangement 45, 46 respectively, for the gate electrode of the transistor in the switchable high-frequency amplifying arrangement 15, 16 respectively, whereas the DC bias voltage can be maintained constant via the fourth DC switching arrangement 59.

When used in a set up with the fourth matching circuit 49, 50 respectively, with mutually dependent dimensions, the line length of the respective outputside signal line 53, 54 is such that an open-circuit appears on the output 55, 56 respectively, when the associated switchable high-frequency amplifying arrangement 15, 16 respectively, is blocked. The blocked signal processing branch does not produce any noise then for the switched, operating signal processing branch.

With reference to the exemplary embodiment shown in the Figure, it is clearly evident that input impedances of the switchable high-frequency amplifying arrangements 15 and 16, which impedances are different due to the high-frequency preamplifiers 11 and 12 operating as an isolation in the switched or blocked state, do not have any effect on the input impedances on the terminals 5 and 6 respectively, of the inserting devices 2 and 3 respectively, when the amplifying arrangements 15 and 16 are in the switched state or in the blocked state. Therefore, the matching required here is irrespective of the switching state of the switchable high-frequency amplifying arrangements 15 and 16, respectively.

The exemplary embodiment shown is preferably suitable for separately receiving cross-polarized high-frequency signals and guarantees a very good separation of the orthogonally polarized waves. The reception of highly broadband signals is then possible, without the dimensioning of individual line lengths, especially the lengths of the signal lines 23 and 24, being critical. Only slight switching losses will occur, and the noise can be maintained low, so that, on the whole, a highly low-noise transmission is made possible.

I claim:

1. Circuit arrangement for selectively processing a first or a second high-frequency signal simultaneously extracted from a common waveguide cavity, while minimizing reflections back into the common waveguide cavity, comprising:

a first probe extending into a waveguide cavity for extracting a first high-frequency signal from the waveguide cavity, the first probe having a characteristic impedance associated therewith;

a second probe extending into the waveguide cavity for simultaneously extracting a second high-frequency signal from the waveguide cavity, the second probe having a characteristic impedance associated therewith;

a first preamplifier for amplifying the first high-frequency signal, the first preamplifier having a constant bias applied thereto to produce a fixed input impedance at a respective input thereof and a fixed output impedance at a respective output thereof;

a second preamplifier for amplifying the second high-frequency signal, the second preamplifier having a constant bias applied thereto to produce a fixed input impedance at a respective input thereof and a fixed output impedance at a respective output thereof;

a first matching circuit connecting the first probe to the input of the first preamplifier and matching the characteristic impedance of the first probe to the fixed input impedance of the first preamplifier;

a second matching circuit connecting the second probe to the input of the second preamplifier and matching the characteristic impedance of the second probe to the fixed input impedance of the second preamplifier;

a first switchable high-frequency amplifying arrangement for selectively amplifying or blocking the first high-frequency signal, the first high-frequency amplifying arrangement having an input impedance associated therewith and an output impedance associated therewith, each of which varies depending upon whether the first high-frequency amplifying arrangement is amplifying or blocking the first high-frequency signal;

a second switchable high-frequency amplifying arrangement for selectively amplifying or blocking the second high-frequency signal, the second high-frequency amplifying arrangement having an input impedance associated therewith and an output impedance associated therewith, each of which varies depending upon whether the second high-frequency amplifying arrangement is amplifying or blocking the second high-frequency signal;

a third matching circuit connecting the output of the first preamplifier to the input of the first high-frequency amplifying arrangement for matching the fixed output impedance of the first preamplifier to the varying input impedance of the first high-frequency amplifying arrangement;

a fourth matching circuit connecting the output of the second preamplifier to the input of the second high-frequency amplifying arrangement for matching the fixed output impedance of the second preamplifier to the varying input impedance of the second high-frequency amplifying arrangement, whereby the fixed input and output impedances of the first and second preamplifiers substantially prevent reflections back into the waveguide cavity irrespective of whether the first and second high-frequency amplifying arrangements are respectively amplifying or blocking the first and second high-frequency signals respectively.

2. Circuit arrangement as claimed in claim 1 wherein the first and second matching circuit each include a signal line with a respective length and a respective characteristic impedance, the high-frequency first and second signals respectively being transported from the first and second probes respectively to the first and second high-frequency preamplifiers respectively, and wherein the lengths and characteristic impedances of the respective signal lines are tuned to the frequency of the respective high-frequency signals to avoid signal reflection.

3. Circuit arrangement as claimed in claim 1 wherein the third and fourth matching circuits each have a respective DC-isolation element for DC-isolation of the, first and second high-frequency preamplifiers from the first and second high-frequency amplifying arrangements respectively.

4. Circuit arrangement as claimed in claim 1, wherein the high-frequency preamplifiers and the high-frequency amplifying arrangements comprise transistors which have a high charge carrier mobility.

5. Receiver for receiving satellite signals, comprising a circuit arrangement for selectively processing a first or a second high-frequency signal simultaneously extracted from a common waveguide cavity, while minimizing reflections back into the common waveguide cavity, comprising:

a first probe extending into a waveguide cavity for extracting a first high-frequency signal from the waveguide cavity, the first probe having a characteristic impedance associated therewith;

a second probe extending into the waveguide cavity for simultaneously extracting a second high-frequency signal from the waveguide cavity, the second probe having a characteristic impedance associated therewith;

a first preamplifier for amplifying the first high-frequency signal, the first preamplifier having a constant bias applied thereto to produce a fixed input impedance at a respective input thereof and a fixed output impedance at a respective output thereof;

a second preamplifier for amplifying the second high-frequency signal, the second preamplifier having a constant bias applied thereto to produce a fixed input impedance at a respective input thereof and a fixed output impedance at a respective output thereof;

a first matching circuit connecting the first probe to the input of the first preamplifier and matching the characteristic impedance of the first probe to the fixed input impedance of the first preamplifier;

a second matching circuit connecting the second probe to the input of the second preamplifier and matching the characteristic impedance of the second probe to the fixed input impedance of the second preamplifier;

a first switchable high-frequency amplifying arrangement for selectively amplifying or blocking the first high-frequency signal, the first high-frequency amplifying arrangement having an input impedance associated therewith and an output impedance, each of which varies depending upon whether the first high-frequency amplifying arrangement is amplifying or blocking the first high-frequency signal;

a second switchable high-frequency amplifying arrangement for selectively amplifying or blocking the second high-frequency signal, the second high-frequency amplifying arrangement having an input impedance associated therewith and an output impedance associated therewith, each of which varies depending upon whether the second high-frequency amplifying arrangement is amplifying or blocking the second high-frequency signal;

a third matching circuit connecting the output of the first preamplifier to the input of the first high-frequency amplifying arrangement for matching the fixed output impedance of the first preamplifier to the varying input impedance of the first high-frequency amplifying arrangement;

a fourth matching circuit connecting the output of the second preamplifier to the input of the second high-frequency amplifying arrangement for matching the fixed output impedance of the second preamplifier to the varying input impedance of the second high-frequency amplifying arrangement, whereby the fixed input and output impedances of the first and second preamplifiers substantially prevent reflections back into the waveguide cavity irrespective of whether the first and second high-frequency amplifying arrangements are respectively amplifying or blocking the first and second high-frequency signals respectively.

* * * * *